(12) United States Patent
Nelson et al.

(10) Patent No.: US 6,324,065 B1
(45) Date of Patent: Nov. 27, 2001

(54) STIFFENER FOR A PRINTED CIRCUIT BOARD

(75) Inventors: Erik Nelson, Upton; Edward Claprood, Southboro; Paul T. Tirrell, Uxbridge, all of MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/281,846

(22) Filed: Mar. 31, 1999

(51) Int. Cl.[7] .................................................... H05K 7/14
(52) U.S. Cl. ...................... 361/754; 361/759; 361/801; 361/802; 361/825; 211/41.17; 248/221.11
(58) Field of Search ................................ 361/686, 728, 361/752, 753, 754, 759, 796–798, 801, 802, 825; 211/41.17; 248/220.21, 221.11

(56) References Cited

U.S. PATENT DOCUMENTS

| | | | |
|---|---|---|---|
| 4,984,133 | 1/1991 | Casanova et al. | 361/683 |
| 5,216,578 * | 6/1993 | Zenitani et al. | 361/690 |
| 5,432,682 * | 7/1995 | Giehl et al. | 361/796 |

* cited by examiner

Primary Examiner—Jayprakash N. Gandhi
(74) Attorney, Agent, or Firm—Daly, Crowley & Mofford, LLP

(57) ABSTRACT

A stiffener supports a printed circuit board during insertion and removal within a slot of a card cage having one or more electrical connectors. The stiffener has a rigid elongated member that defines an elongated channel. The elongated member is adapted to engage an edge of the printed circuit board along the channel. The member has an engagement portion for receiving an applied force, a driver portion for engaging an electrical connecting mechanism, and a translator portion for translating the force from the engagement portion to the driver portion.

7 Claims, 16 Drawing Sheets

STIFFENER FOR A PRINTED CIRCUIT BOARD

BACKGROUND OF THE INVENTION

The invention relates generally to electrical cabinets adapted to store, or house, electrical components, and, more particularly to printed circuit boards used in data storage and transfer systems.

As is known in the art, electrical cabinets are used to store, or house, a variety of electrical components such as printed circuit boards. The electrical cabinets allow the components within the cabinet to be interconnected and also allow the internal components to be connected to components external to the cabinets. The cabinets typically have an access door and a number of compartments, such as a card cage, i.e., a housing to store the various interconnected printed circuit boards. In addition, the individual components within the cabinet may be replaced or removed to a different location for repair.

Typically, some of the components are printed circuit boards arranged in a card cage, or housing, in an array of vertical or horizontal guide slots (i.e., a linear array of guide slots) provided between opposing sides of the cabinet. Each board is insertable into a corresponding pair of the opposing guide slots and is urged towards the rear of the cabinet to enable an electrical connector mounted to the rear edge of the board to engage, and thereby electrically connect to, a backplane. A backplane typically is a printed circuit board which contains a plurality of electrical connectors. The backplane commonly is referred to as a mother board. The other printed circuit boards discussed above, which electrically connect to the mother board, commonly are referred to as daughter boards.

As currently configured, when a technician inserts a daughter printed circuit board into one of the guide slots, he/she may inadvertently bend or buckle the printed circuit board. In order to accommodate the quantity and speed of data in systems currently in use, printed circuit boards require a large number of densely packed connectors. Each of these connectors provides resistance when the printed circuit board is inserted into the housing and connected with the backplane. Thus, the greater the number of connectors, the larger the force required to insert and connect the printed circuit board. For example, an existing printed circuit board may require 200 pounds or more of force to insert and connect the printed circuit board to the backplane. However, the printed circuit boards may not have sufficient rigidity to withstand such forces. Therefore, the printed circuit boards may bend, buckle, break, not make a proper electrical connection and/or become misaligned upon insertion into the housing and connection to the backplane.

In addition, when the printed circuit boards buckle, the connectors may be misaligned, and, thus, the insertion force that is required to electrically connect the daughter boards to the mother board may increase. The total required insertion force may surpass the maximum insertion force suggested by the manufacturer for the printed circuit board and/or for the electrical connectors.

SUMMARY OF THE INVENTION

In one aspect of the invention, a stiffener supports a printed circuit board during insertion and removal within a slot of a card cage having one or more electrical connectors. The stiffener has a rigid elongated member that defines an elongated channel. The elongated member is adapted to engage an edge of the printed circuit board along the channel. The member has an engagement portion for receiving an applied force Preferred embodiments of this aspect of the invention include a driver portion for engaging an electrical connecting mechanism, and a translator portion for translating the force from the engagement portion to the driver portion. Attachment points attach the stiffener to the printed circuit board. Three distinct portions form a U-shaped member that defines the channel. The stiffener attaches to the printed circuit board along the channel and extends substantially the entire length of an edge of the printed circuit board. The engagement portion is disposed at one end of the stiffener and abuts a pin where force is applied.

Another aspect of the invention is a printed circuit board having a stiffener as described above.

Embodiments within the scope of the claims may have one or more of the following advantages.

The support device diverts some or all applied insertion forces from the printed circuit board to the electrical connectors. The support device diverts some or all applied extraction forces from the printed circuit board. The support device prevents or reduces misalignment of the printed circuit board. The support device prevents or reduces buckling of the printed circuit board. The support device prevents breakage of the printed circuit board. The support device allows high insertion forces to be applied. The support device allows high extraction forces to be applied. The support device allows the printed circuit board to have a large number of electrical connectors. The support device allows the printed circuit board to have densely packed electrical connectors.

DESCRIPTION OF THE PREFERRED EMBODIMENTS

Figure 1:
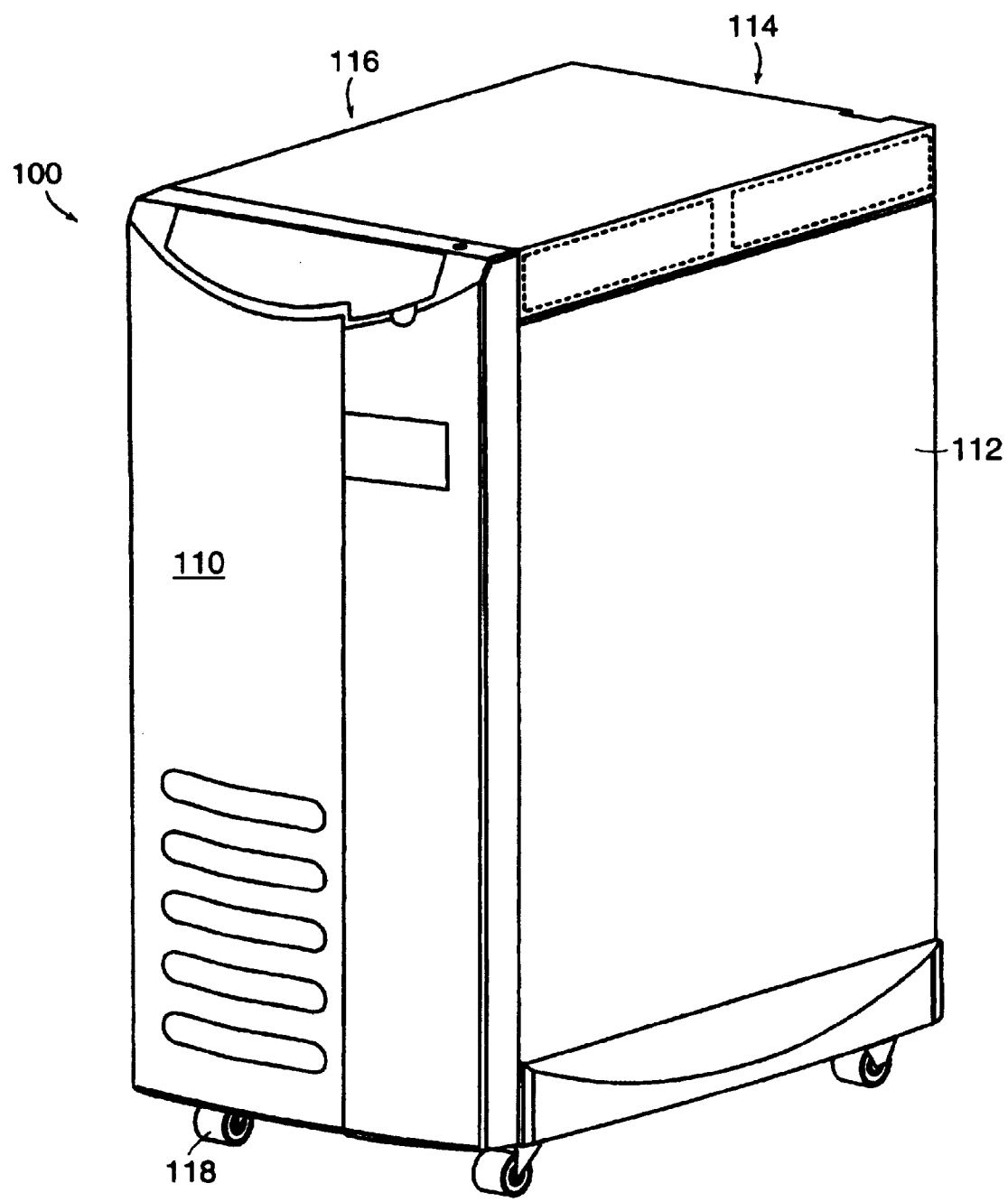
FIG. 1 is an isometric view of an electrical cabinet for storing or housing electrical components such as printed circuit board card cages and printed circuit boards.
Figure 2:
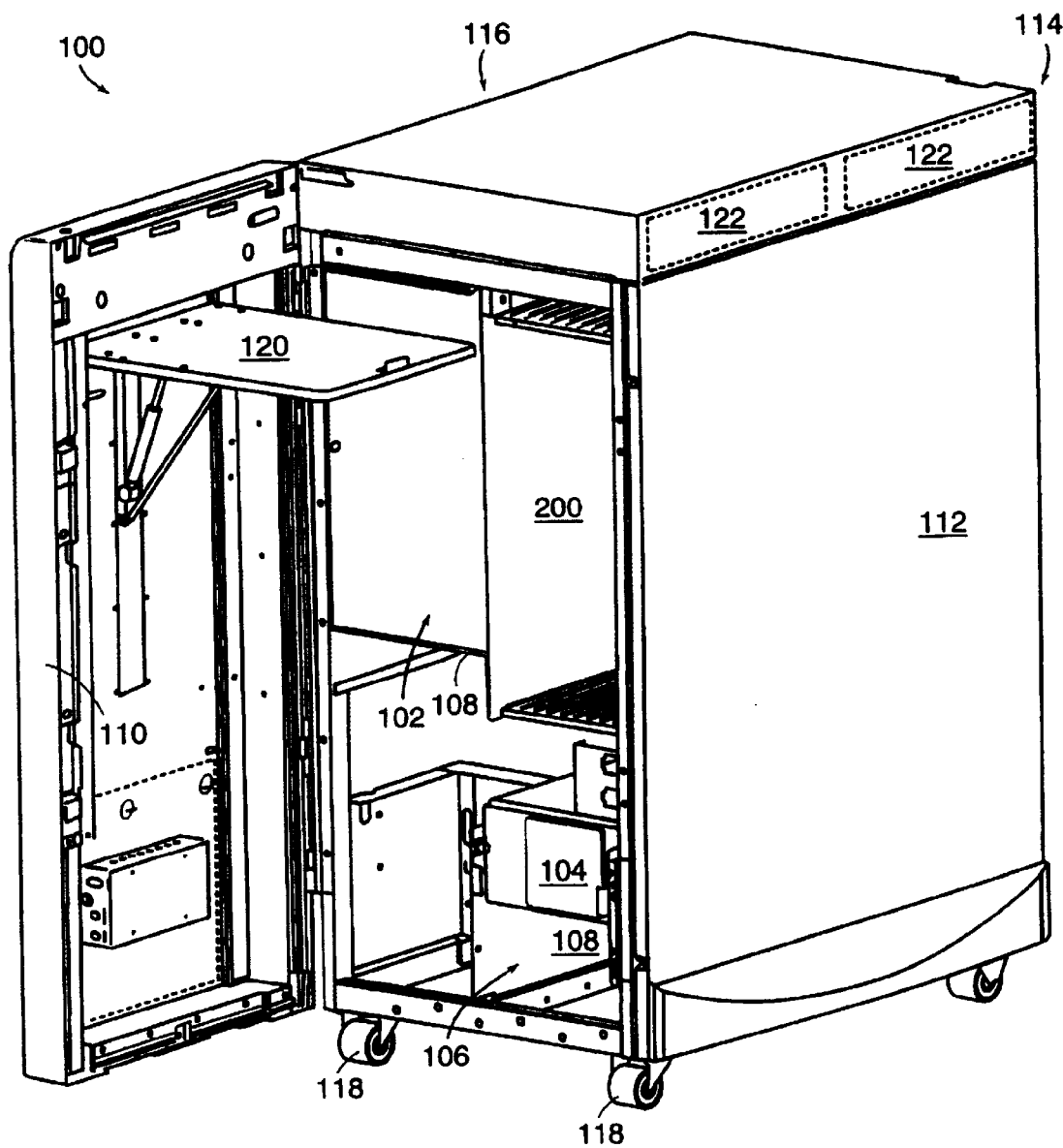
FIG. 2 is an isometric view an interior of the electrical cabinet of claim 1.
Figure 3:
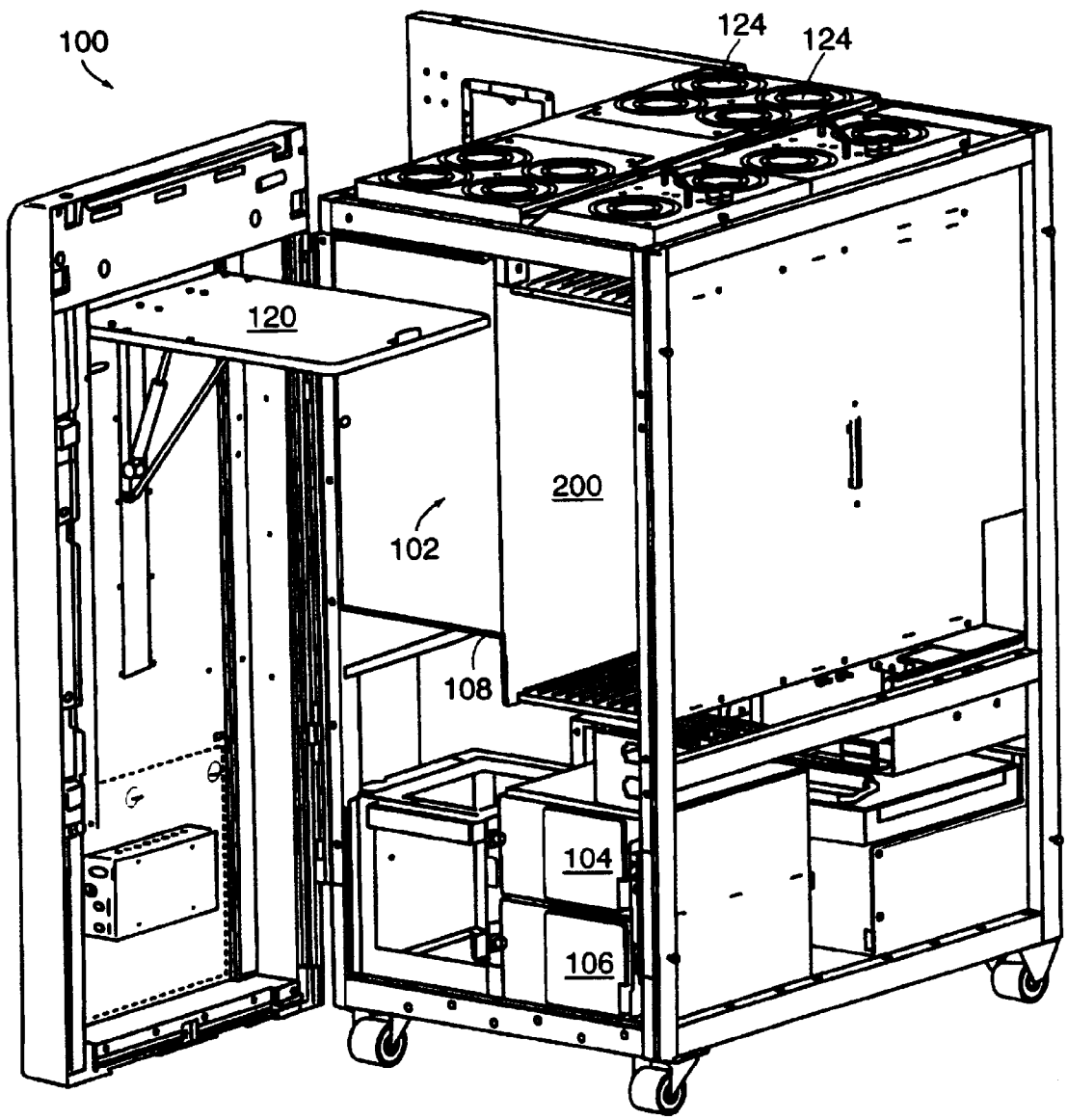
FIG. 3 is another isometric view of an interior of the electrical cabinet of claim 1.

Referring to FIGS. 1–3, an electrical cabinet 100 is adapted for the storage and operation of electrical components, particularly, data storage and transfer technology. For example, electrical components include CPUs, printed circuit boards, batteries, cables, data servers, and laptop computers. Typically, the electrical components are housed within the interior of the cabinet (FIGS. 2 and 3). The electrical components can be interconnected with other components in other electrical cabinets, or are interconnected with other networks. The electrical components reside within various storage compartments 102, 104, 106 within cabinet 100. Electrical cabinet 100 has internal partitions 108 that define the storage compartments 102, 104, 106.

The electrical cabinet 100, has four side-walls 110, 112, 114, 116. Two of the side-walls 110, 114 form access doors. Electrical cabinet 100 stands upright on four wheels 118 and is mobile. Among other elements, electrical cabinet 100 has an extendable platform 120, air vents 122, exhaust fans 124, and a printed circuit board card cage 200.

Figure 4:
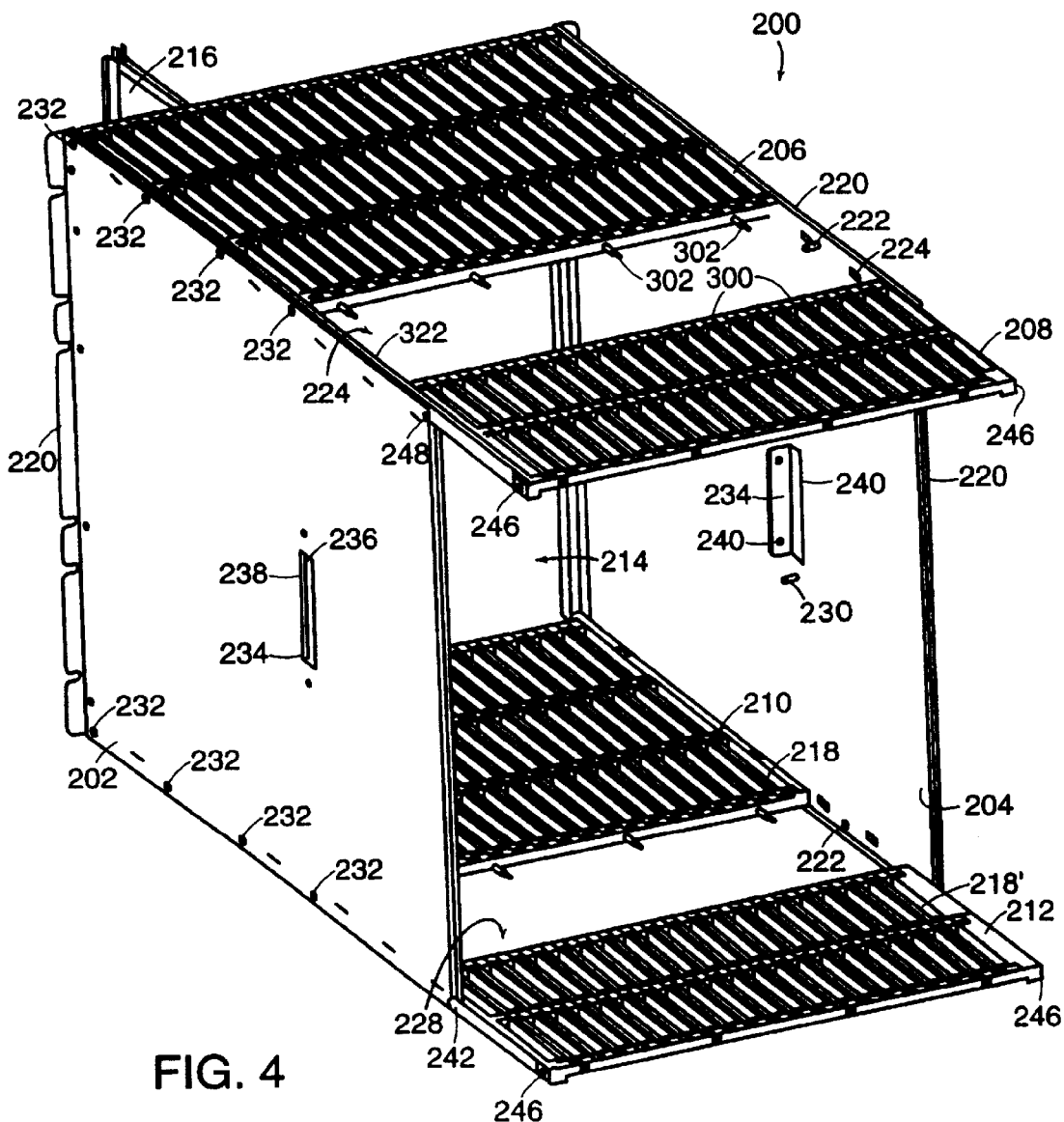
FIG. 4 is an isometric view of a printed circuit board card cage of the electrical cabinet of FIG. 1, wherein a printed circuit daughter board is shown partially installed.
Figure 5:
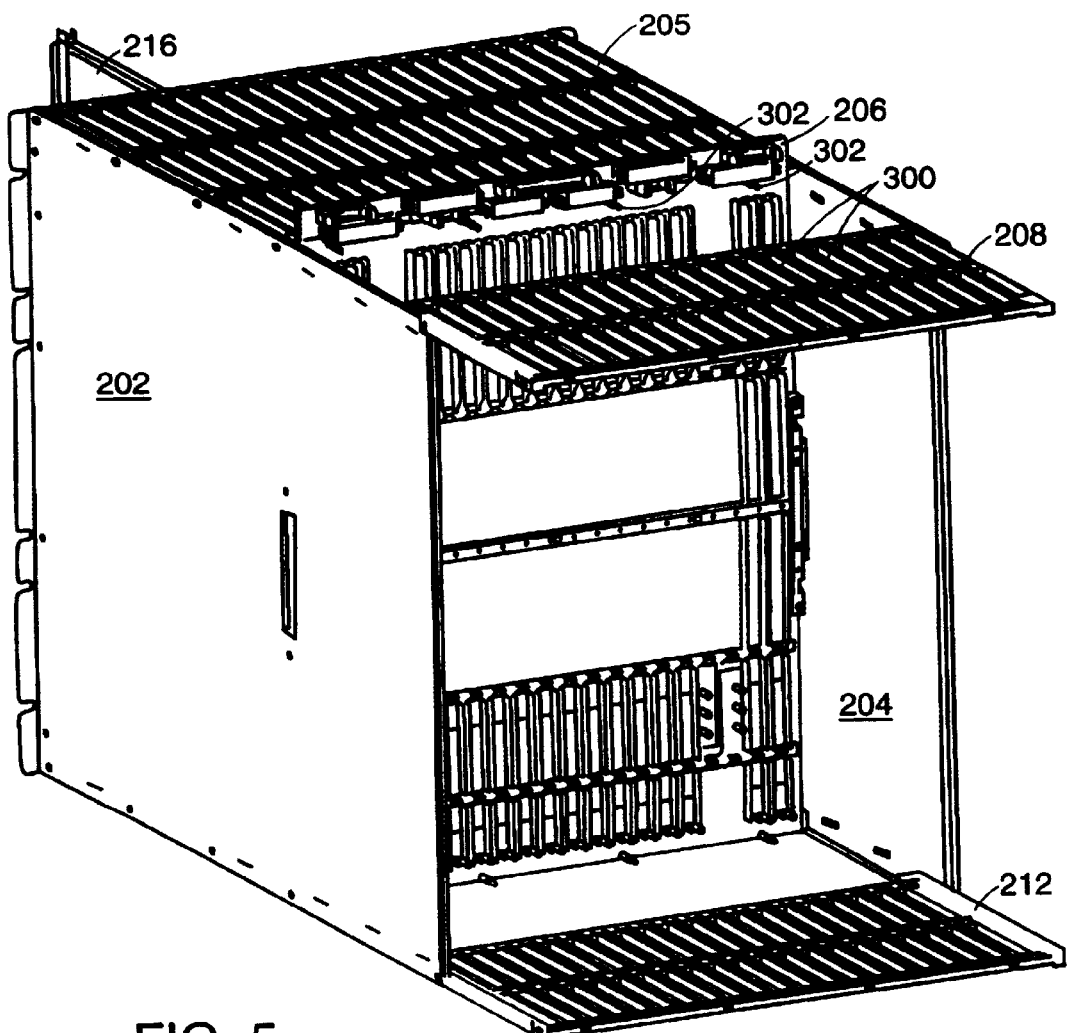
FIG. 5 is an isometric view of the card cage of FIG. 4, wherein a backplane is shown partially installed.

Referring to FIGS. 4 and 5, printed circuit board card cage 200 provides a housing to support a set of printed circuit boards. Card cage 200 includes two opposing sidewalls 202, 204, a ceiling 206, a movable ceiling member 208, a floor 210, and a movable floor member 212. Sidewalls 202, 204 extend from opposing sides of floor 210 to opposing sides of ceiling 206. Thus, card cage 200 includes an internal space for storing printed circuit boards and defines an opening 214 for receiving a printed circuit board, e.g., a daughter board 216. Card cage 200 is, e.g., 25.8" in length, 19.9" in height, and 17.7" in width.

As shown, both ceiling 206 and floor 210 are permanently and securely fixed to sidewalls 202, 204 by corresponding sets of screws 232 (four screws being shown along each of floor 210 and ceiling 206). Sidewalls 202, 204 are made of a sheet metal, and the edges of sidewalls 202, 204 are molded to form a corrugated-like section that provides additional structural support framework 220. Thus, floor 210, ceiling 206, and sidewalls 202, 204 provide a predefined structure that resists deformation and is able to properly align printed circuit boards within card cage 200.

As shown, sidewalls 202, 204 are substantially solid having only several holes punched to accommodate screws and provide certain other surfaces discussed below. Alternatively, sidewalls 202, 204 could be substantially open, e.g., providing only a structural support framework to accommodate daughter board 216, a backplane 226 (FIG. 5), ceiling 206, and movable ceiling member 208.

Floor 210 and ceiling 206 each include a set of twenty slots 218. Floor 210 and ceiling 206 are made of a metal casting to provide structural support. Slots 218 are defined by plastic members that attach to the interior surface of the metal castings. Slots 218 are aligned such that each slot 218 on ceiling 206 is positioned directly above a corresponding slot 218 on floor 210, i.e., card cage 200 includes 20 slot pairs that are aligned in the vertical direction.

Daughter board 216 is sized to fit snugly between and within any two of the corresponding pairs of slots 218. As shown in FIG. 4, daughter board 216 is partially inserted into card cage 200. However, the length of daughter board 216 is approximately the same as the length of both floor 210 and ceiling 206. Thus, when fully inserted, the end of daughter board 216, which is visible in FIG. 4, lies flush with the end of card cage 200 at opening 214.

Ceiling 206 has a length that is shorter than the length of sidewalls 202, 204. The additional area created by the extra length of sidewalls 202, 204 is occupied by movable ceiling member 208, which is aligned with ceiling 206 in a horizontal plane. Movable ceiling member 208 also attaches to and extends between opposing sidewalls 202, 204. However, movable ceiling member 208 is not securely fixed.

Rather, movable ceiling member 208 is slidable in the direction of slots 218. Movable ceiling member 208 has two opposing edges that are directly adjacent to sidewalls 202, 204 and that each fit within a corresponding slide 222. Slides 222 are each formed by (1) an interior side of one of the sidewalls 202, 204 that provides lateral support, (2) an upper edge of structural support framework 220 that forms a lip along the edge of each sidewall 202, 204 to provide vertical support, and (3) a set of notches 244 extending in a horizontal line that is a uniform distance from the lip of support framework 220. Each notch 244 is a portion of one of sidewalls 202, 204 which is punched to form a notch. The line of notches 244 also provides vertical support.

Similarly, movable floor member 212 is attached to and extends between sidewalls 202, 204. Movable floor member 208 also is slidable in the direction of slots 218. Movable floor member 212 attaches along two slides 222 (only one slide being shown) that accommodate opposing side edges of movable floor member 212.

Similar to ceiling member 208 and floor member 212, movable ceiling member 208 and movable floor member 212 each include a set of twenty slots 218'. Slots 218' are defined by plastic members that are identical to the members that define slots 218. Card cage 200 includes twenty slot pairs that are aligned in the vertical direction.

Card cage 200 is symmetrical about a plane that bisects card cage 200 into top and bottom portions. Card cage 200 also is symmetrical about a plane that bisects card cage 200 into left and right portions. Card cage 200 is assembled using parts having common structure. For example, sidewall 202, ceiling 206 and ceiling member 208 have the same structure as sidewall 204, floor 210 and floor member 212 respectively. Each of the corresponding parts are assembled in a position that is rotated 180 degrees from the position of the corresponding part, i.e., the corresponding parts face each other. Therefore, if card cage 200 were turned upside down, card cage 200 would have the same relative structure. Alternatively, card cage 200 could be manufactured without the above-described common parts, and card cage 200 could be asymmetrical either top to bottom or side to side. Thus, in essence, the corresponding parts of card cage 200 can be structurally the same and interchangeable or can be structurally distinct.

Card cage 200 is not symmetrical front to back. For example, as shown, movable ceiling member 208 is approximately ⅔ the length of ceiling member 208, and movable floor member 212 is approximately ⅔ the length of floor member 212. Alternatively, card cage 200 could be symmetrical from front to back.

As show in FIGS. 4 and 5, movable ceiling member 208 and movable floor member 212 are in unsecured positions. In the unsecured position, movable ceiling member 208 slides away from ceiling 206 and defines an opening 224 for receiving a printed circuit board, e.g., backplane 226 (FIG.

5). Movable floor member 212 slides away from floor member 212 and defines another opening 228, e.g., also for receiving backplane 226. As shown, both movable ceiling member 208 and movable floor member 212 can be completely removed from card cage 200 to provide one large contiguous opening. Alternatively, rather than being removable, the range of motion of both movable ceiling member 208 and movable floor member 212 could be limited within corresponding slides 222.

Backplane 226 is inserted transversely to slots 218 and slots 218' and subsequently aligned. To align backplane 226 within card cage 200, four notches 410 (shown in, and discussed in greater detail in relation to, FIG. 11) of backplane 226 accommodate four corresponding registration pins 230 (only one registration pin being shown due to the perspective of FIG. 4). Each sidewall 202, 204 has two registration pins 230 that are symmetrically arranged as described above and that extend from the interior surface of sidewalls 202, 204. As backplane 226 is placed within card cage 200, registration pins 230 are disposed within corresponding notches 410 of backplane 226.

After backplane 226 is inserted and aligned, backplane 226 is attached within card cage 200. Sidewalls 202, 204 each include a corresponding support member 234 to attach the printed circuit board in position within card cage 200. Each support member 234 extends inward along the interior surface of corresponding sidewalls 202, 204. Support members 234 are punched from a section of corresponding sidewalls 202, 204 and are disposed at a 90 degree angle to corresponding sidewalls 202, 204. Each support member 234 has a support portion 236 that includes two holes 240. The holes accommodate screws that attach backplane 226 to card cage 200. Each support member 234 also has an attachment portion 238 that connects support members 234 to corresponding internal sides of sidewalls 202, 204. Alternatively, support members 234 could be, e.g., an L-shaped bracket riveted to the internal surface of corresponding sidewalls 202, 204.

After backplane 226 is inserted, aligned, and attached within card cage 200, movable ceiling member 208 and movable floor member 212 are placed in a secured position (FIG. 6) to firmly secure backplane 226 to card cage 200. Movable ceiling member 208 and movable floor member 212 each slide toward ceiling 206 and floor 210 respectively. Backplane 226 is sandwiched between ceiling 206 and movable ceiling member 208 as well as between floor 210 and movable floor member 212.

In the present embodiment, a variety of fastening mechanisms can be used to firmly secure backplane 226 between ceiling 206 and movable ceiling member 208 (or floor 210 and movable floor member 212). As shown most clearly in FIG. 4, movable ceiling member 208 and movable floor member 212 each include a set of fasteners 300 while ceiling 206 and floor 210 each include a set of studs 302. Studs 302 are aligned with corresponding fasteners 300 along an axis extending in the direction of slots 218, 218'. Both fasteners 300 and studs 302 include cooperative threads that allow card cage 200 to securely fasten backplane 226. An upper edge of backplane 226 fastens between ceiling 206 and movable ceiling member 208. A lower edge of backplane 226 fastens between floor 210 and movable floor member 212.

Card cage 200 also includes an additional securing mechanism to secure movable members 208, 212 in the secured position. The securing mechanism presses one of four corresponding corner portions of sidewalls 202, 204 between movable members 208, 212 and the head of one of four corresponding rotatable screws 246. A shank of each of the screws 246 extend into a corresponding corner of the movable members 208, 212. Each of the movable members 208, 212 have two screws 246 located on opposite side edges and nearest an exterior edge of movable members 208, 212.

The corresponding corners of sidewalls 202, 204 have a relieved portion that forms a slot 242. Each of the four slots 242 accommodates the shank of corresponding screws 246. When movable members 208, 212 are in the secured positions, the heads of the screws 246 can be rotated to secure movable members 208, 212. The securing mechanism additionally secures backplane 226. In addition, the securing mechanism provides a means to quickly secure movable members 208, 212 in the secured positions without engaging fasteners 300, e.g., when moving or installing card cage 200 within cabinet 100, e.g., prior to installing backplane 226.

Figure 6:
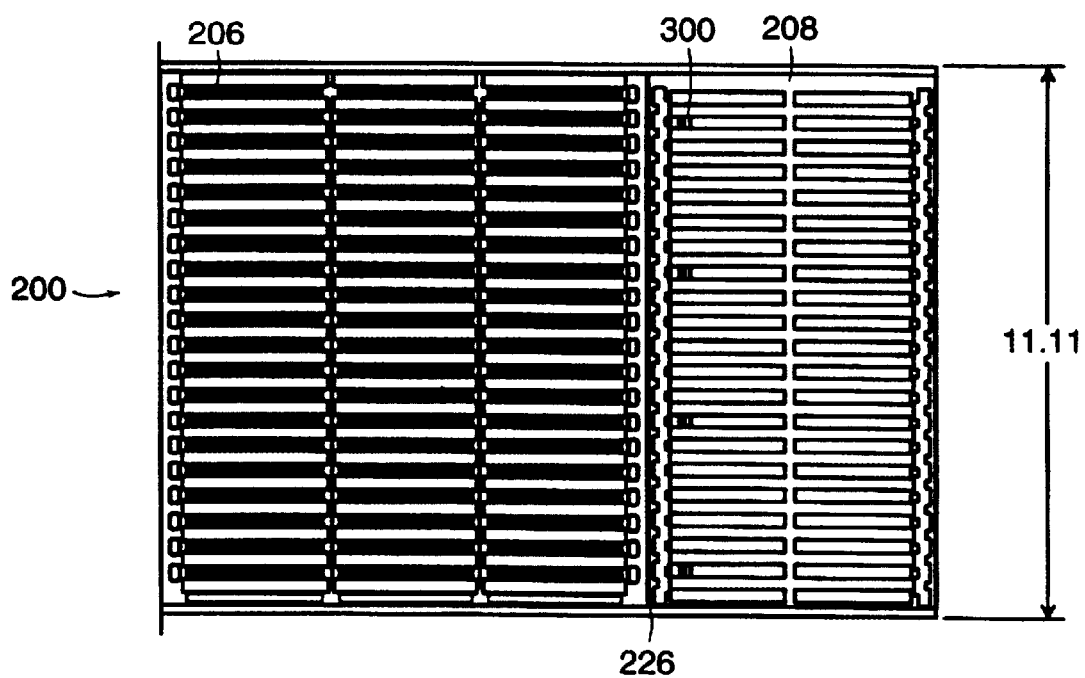
FIG. 6 is a top schematic view of the card cage of FIG. 4, wherein a ceiling of the card cage is shown in a closed position.

As shown in FIG. 6, movable ceiling member 208 firmly secures backplane 226 when movable ceiling member 208 is in the secured position. Studs 302 of ceiling 206 extend through holes along the upper edge of backplane 226 while the lower edge of backplane 226 has notches that rest on studs 302 of floor 210. When each fastener 300 engages a corresponding stud 302 and is tightened, movable ceiling member 208 acts as a vice to firmly secure backplane 226 against ceiling member 208. Similarly, floor 210 and movable floor member 212 engage the lower edge of backplane 226. Thus, when movable members 208, 212 are in secured positions, backplane 226 is fixed in position.

Figure 7:
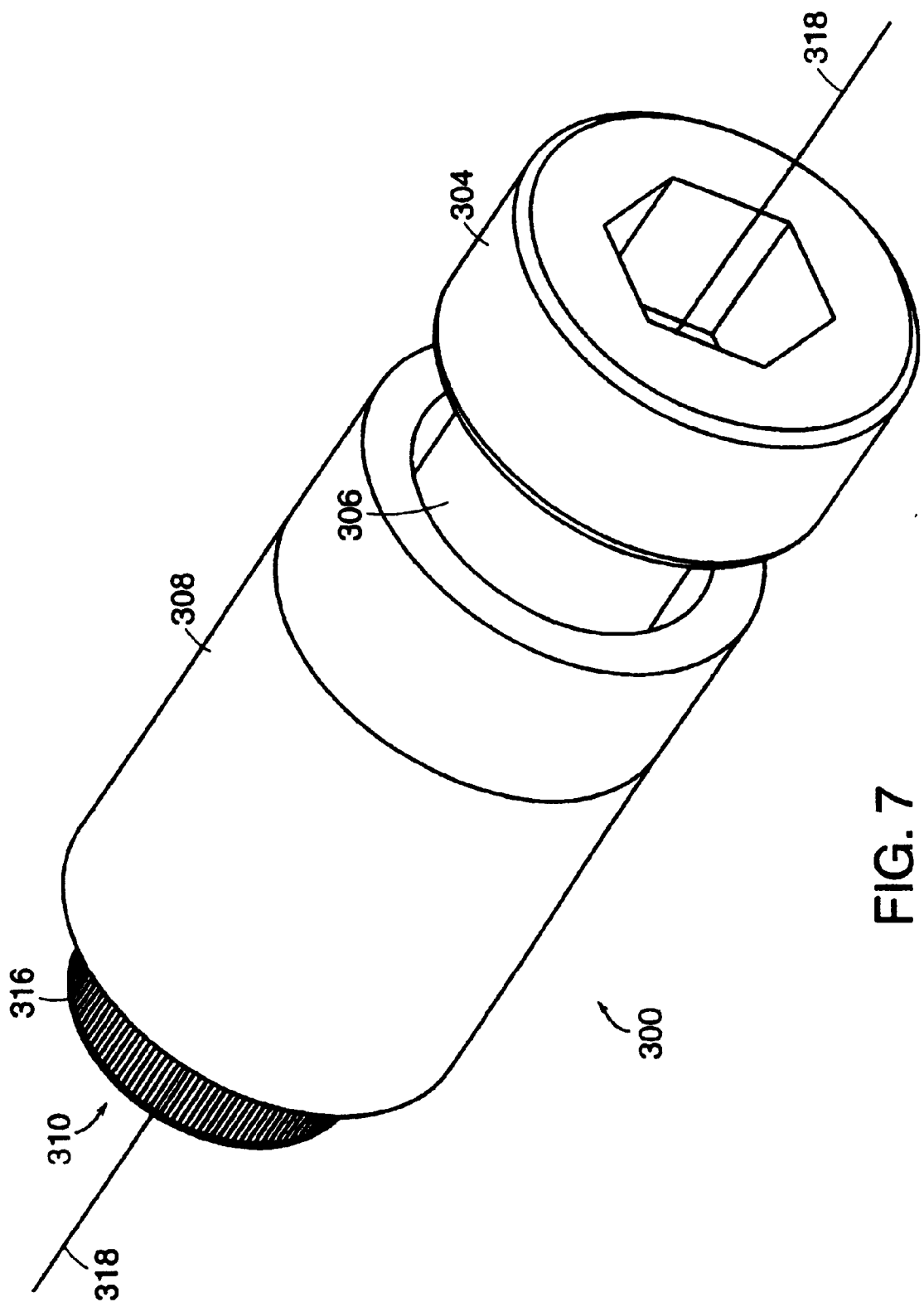
FIG. 7 is an isometric view of a fastener of the card cage of FIG. 4.
Figure 8:
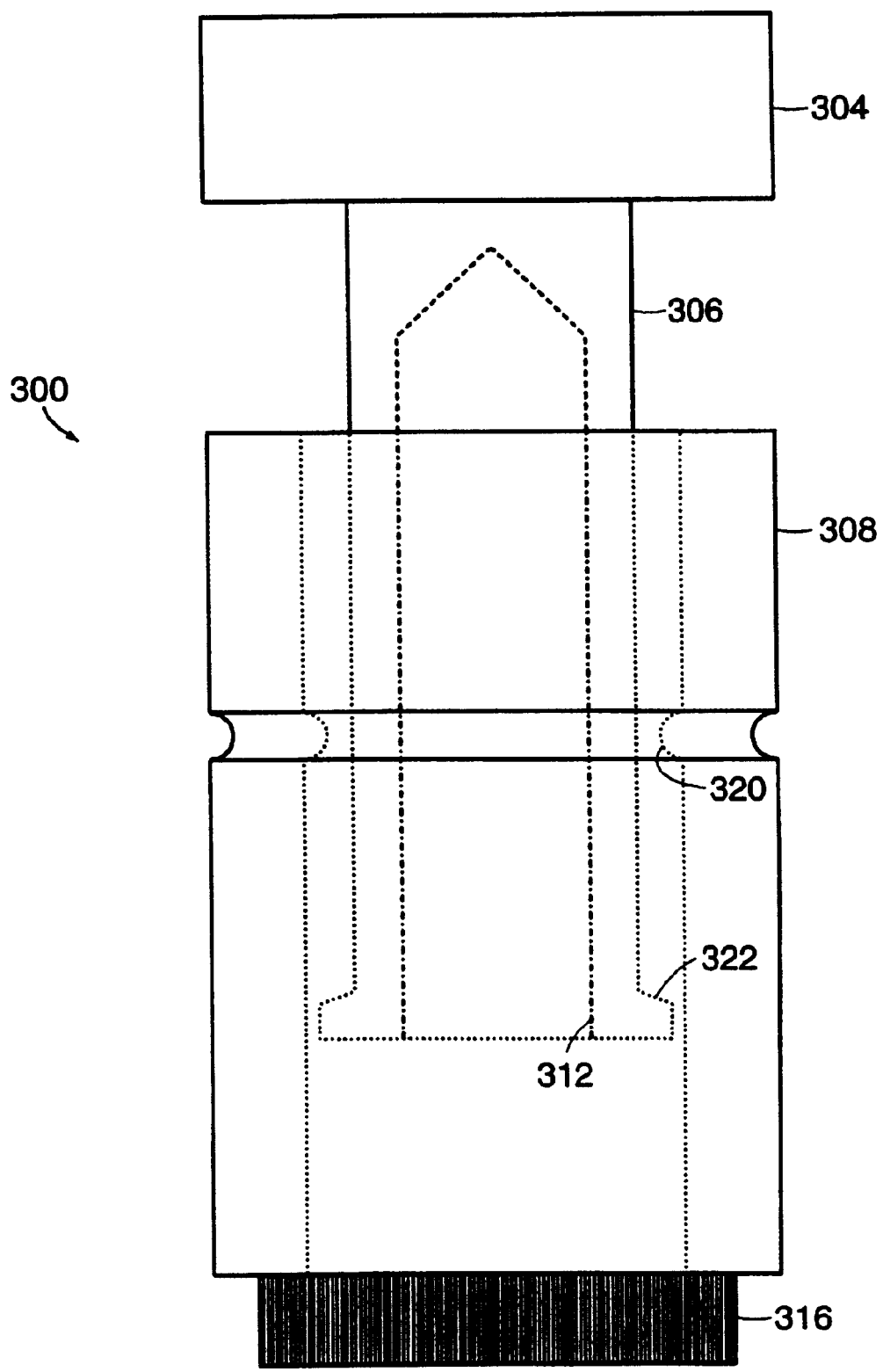
FIG. 8 is a side schematic view of the fastener of FIG. 7, wherein portions of the fastener are shown in phantom.

Referring to FIGS. 7 and 8, fasteners 300 are captive metal fasteners that are permanently anchored in the casting of the corresponding movable floor member 212 (FIG. 4) or movable ceiling member 208 (FIG. 4). Fasteners 300 (as well as studs 302) are made of, e.g., 316 stainless steel. Each captive fastener 300 is arranged about a longitudinal axis 318. Each fastener 300 has a head 304, a shank 306 and a sleeve 308. Head 304 is attached to shank 306 and both rotate freely within sleeve 308.

Shank 306 includes a hollow interior portion 310 containing an internal thread 312. Hollow interior portion 310 faces, and is aligned with, stud 302 when fastener 300 is attached to movable members 208, 212. Thus, when movable members 208, 212 are in the secured positions, shank 306 fits over stud 302 and internal thread 312 cooperates with and engages an external thread 314 (FIG. 9) of stud 302.

Head 304 has, e.g., a hexagonal recess to accommodate an allen-type wrench. Thus, head 304 can be used to secure fastener 300 over stud 302. Head 304 interacts with sleeve 308 to partially captivate shank 306 within sleeve 308. Because head 304 is external to sleeve 308 and has an outer diameter that is wider than the internal diameter of sleeve 308, head 304 limits the movement of shank 306 in the direction of stud 302 along longitudinal axis 318.

A pair of internal ridges 320 and 322 complete the captivation of shank 306 within sleeve 308. Ridge 320 extends about the inner surface of sleeve 308 to form a circular ring. Ridge 322 extends about the outer surface of an end of shank 306 to form an opposing circular ring. Thus, as ridge 322 moves towards ridge 320, e.g., when fastener 300 is loosened, ridge 322 will ultimately engage ridge 320 and prevent further motion along longitudinal axis 318 in the direction away from stud 302.

Sleeve 308 further includes a ribbed portion 316 having a set of parallel ribs that extend completely about the circumference of the end portion. Ribbed portion 316 has ribs that extend longitudinally along fastener 300 and in the direction of slots 218 when fastener 300 is attached to one of movable members 208, 212.

To attach fastener 300 to one of movable members 208, 212, shank 306 is inserted into sleeve 308 prior to the complete formation of ridge 320. Ribbed portion 316 of sleeve 308 is clenched into a prefabricated hole in the metal casting of movable members 208, 212. Ribbed portion 316 provides both longitudinal resistance that tends to secure fastener 300 within the hole as well as rotational resistance that tends to prevent sleeve 308 from turning within the hole. Ribbed portion 316 reforms the metal casting around the ribs and may prevent cracking or other deformation of the casting, which may occur when a fastener having a serrated/ toothed tip is clenched into a metal casting.

When fastener 300 is clenched into the metal casting, e.g., of movable ceiling member 208, an additional force is applied to head 304 which compresses sleeve 308 against the casting. Thus, ridge 320 is forced further inward and into a fully formed position that captivates shank 306.

Figure 9:
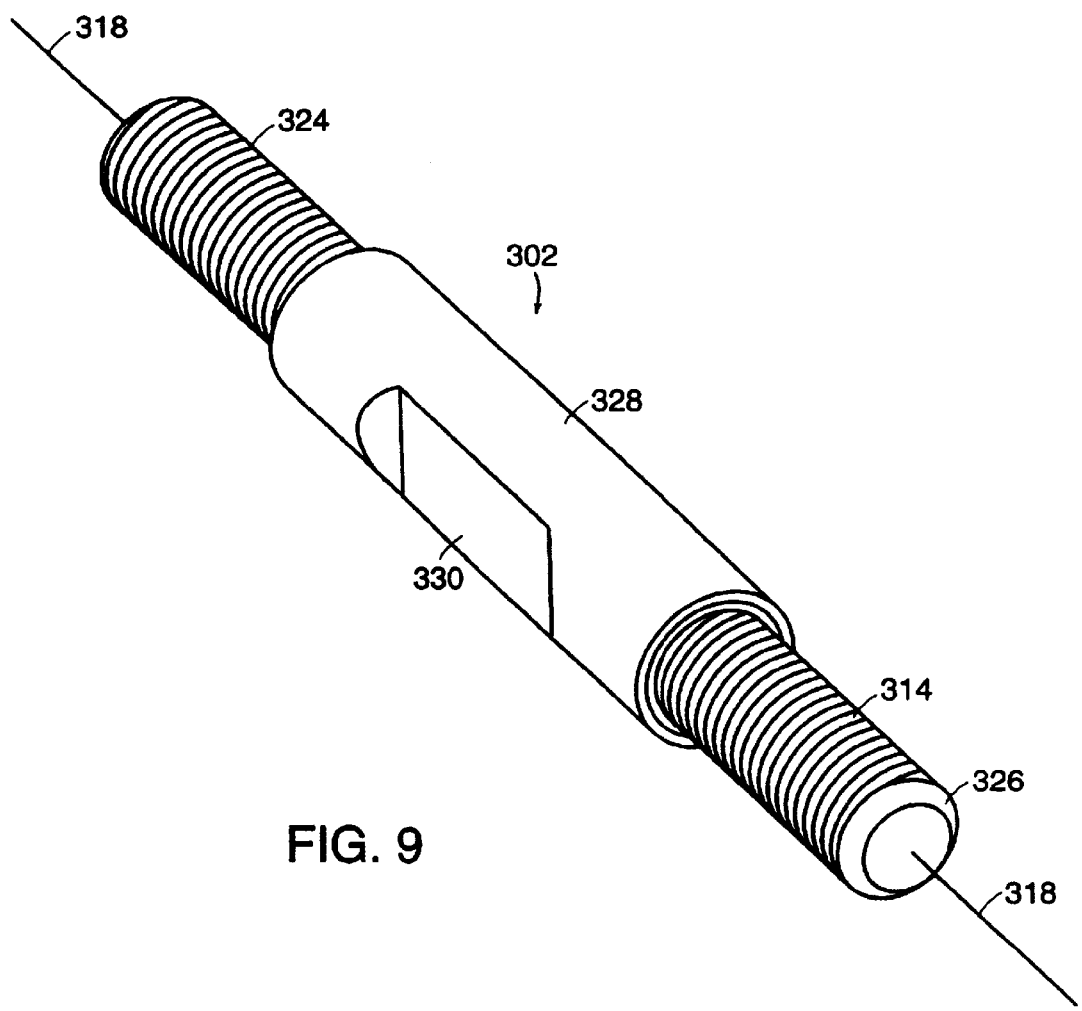
FIG. 9 is an isometric view of a stud of the card cage of FIG. 4.
Figure 10:
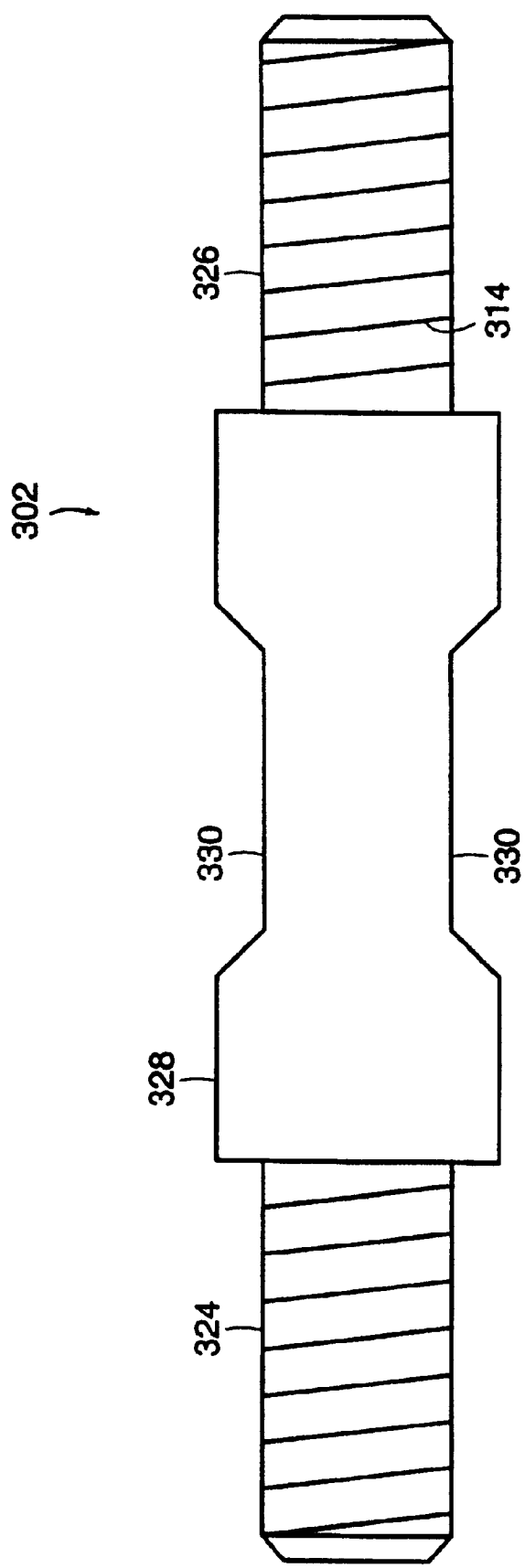
FIG. 10 is a side schematic view of the stud of FIG. 9.

Referring to FIGS. 9–10, each stud 302 has arms 324, 326 located on opposite ends of a support shank 328. Opposing arms 324, 326 extend in opposite directions from support shank 328 along longitudinal axis 318. Both of arms 324, 326 have external threads 314 sized to engage internal thread 312 of (FIG. 8) fastener 300.

Support shank 328 has two recesses 330 located on opposite sides of shank 328. Together, recesses 330 form a grip to accommodate a tool used to install stud 302 to either ceiling 206 or floor 210 (FIG. 4). Stud 302 is screwed into a prefabricated hole of one of the metal castings. Stud 302 can be screwed rather than clenched into the hole because a hollow passage is not required to pass shank 306 from one side of the hole to another. Stud 302 is symmetrical and either arm 324, 326 can be inserted into the prefabricated hole of the casting.

When installed, the entire external thread 314 can extend into and engage internal thread 312. However, the entire external thread 314 does not need to engage internal thread 312 to secure one of the movable members 208, 212 in the secured position. Thus, in combination, fastener 300 and stud 302 provide a range of positions in which movable members 208, 212 can be secured. In the present embodiment, movable member 208, 212 can be tight against backplane 226 within the range of positions provided by fastener 300 and stud 302. For example, each arm 324, 326 containing an external thread 314 is 0.375" and can be entirely accommodated within fastener 300. In addition, fastener 300 can accommodate a portion of support shank 328. For example, stud 302 can extend into fastener 300 approximately 0.6". Thus, in the secured position, card cage 200 can accommodate backplanes having various widths as long as the widths of the backplanes fall within the range of positions defined by stud 302 and fastener 300, e.g., between zero and less than 0.6" (to provide sufficient engagement between threads 312, 314 to secure the backplane.)

The range of positions is limited by the threaded length of arms 324, 326 of stud 302 as well as by the internal length of internal thread 312 of fastener 300. Alternatively, therefore, a longer internal thread capable of accommodating a longer stud 302 would allow movable members 208, 212 to be secured through a wider range of positions.

Figure 11:
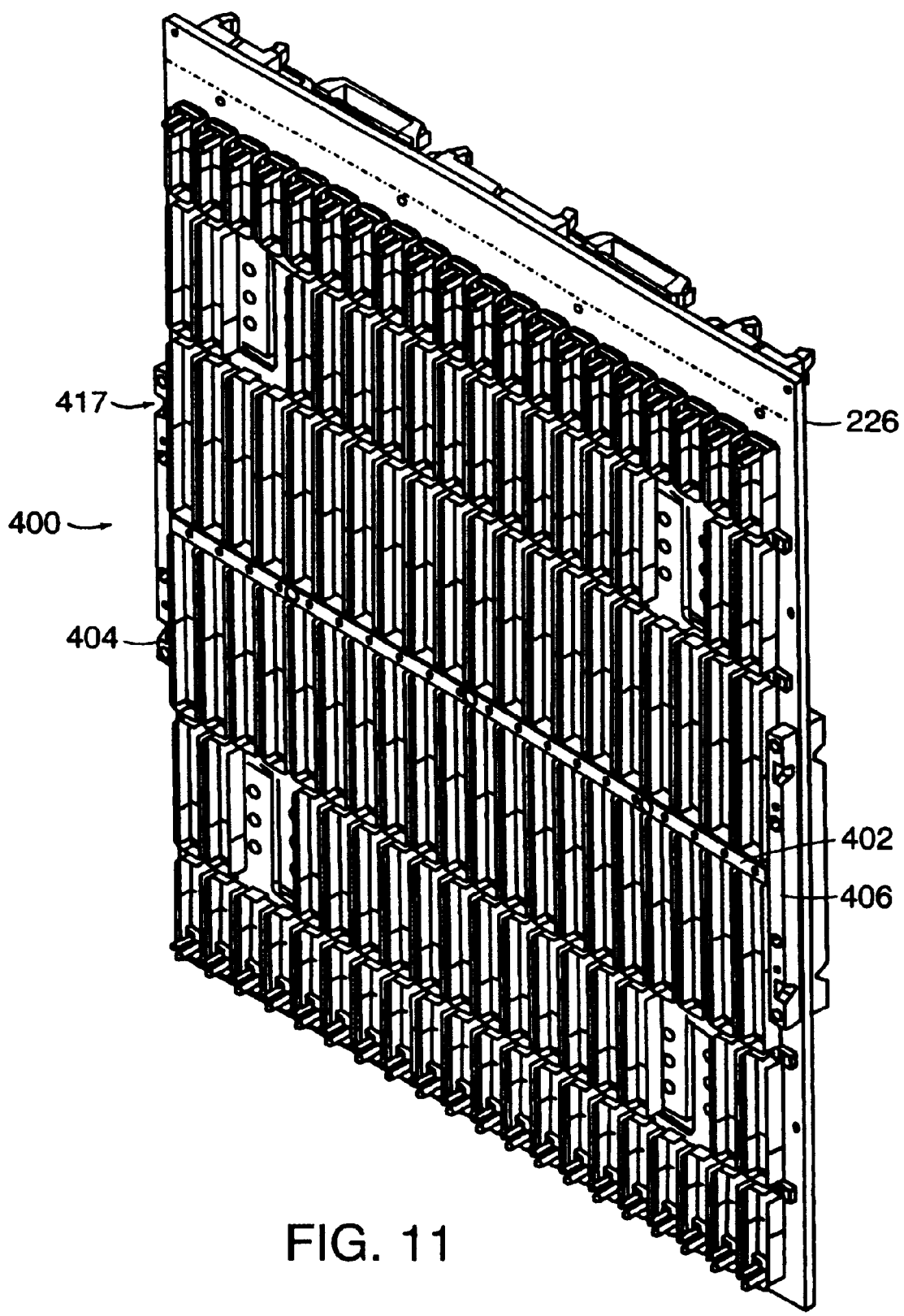
FIG. 11 is an isometric view of the backplane of FIG. 5.
Figure 12:
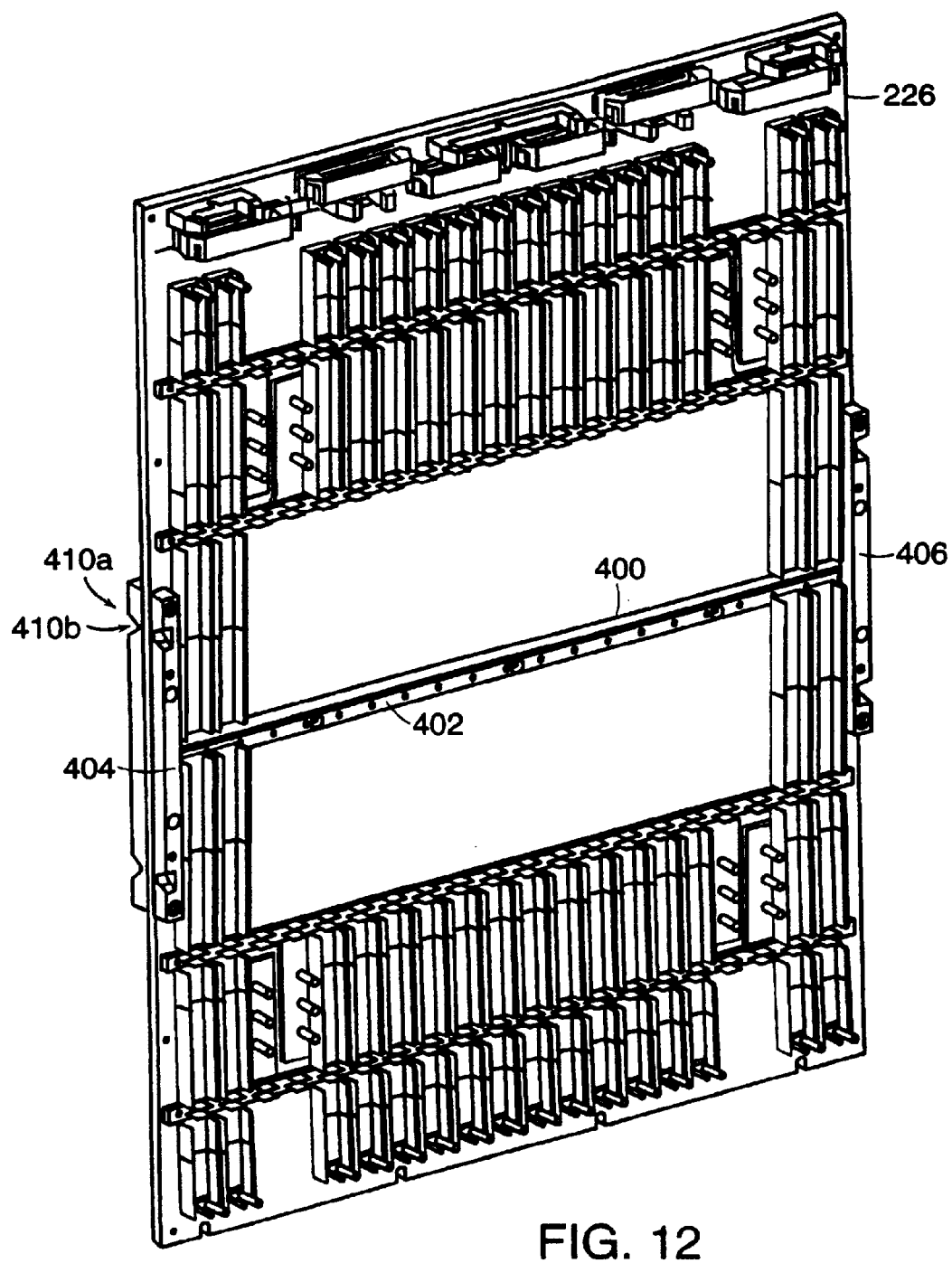
FIG. 12 is an isometric view of an opposite side of the backplane of FIG. 11.

Referring to FIGS. 11–12, backplane 226 includes a support device 400 to reinforce backplane 226 when daughter board 216 is inserted or extracted. Support device 400 is a stiffener to provide additional structural support. Support device 400 is metal finished with an electrodeposited zinc coating.

Support device 400 includes a cross member 402 which is a cross beam mounted horizontally and approximately bisecting backplane 226. Cross member 402 provides an opposing force in a direction of motion of the daughter boards along slots 218 to resist the force of daughter boards 216 against backplane 226. Cross member 402 is, e.g., 16.14" in length, 0.375" in width, and 0.438" in depth. Cross member 402 includes three equidistantly spaced holes 412 through which cross member 402 can be attached to backplane 226 by screws. Cross member 402 also includes twenty equidistantly spaced guide holes 414 to provide a further mechanism to ensure backplane 226 is properly positioned.

Two end support members 404, 406 are attached to corresponding ends of the cross member, e.g., to form an H-shaped structure. End support members 404, 406 extend vertically along two side edges of backplane 226. Each end support member 404, 406 is, e.g., 6.75" in length, 0.375" in width and 0.438" in depth. End support members 404, 406 provide a mechanism to secure cross member 402 and attach backplane 226 to sidewalls 202, 204 of card cage 200 (FIG. 4). For example, each end support member 404, 406 includes four holes 412' to accommodate screws. The outer two holes 412' of each end support member 404, 406 are used to attach each corresponding end support member 404, 406 to backplane 226. The inner two holes 412' are used to attach the corresponding end support member 404, 406 to support member 234 of card cage 200 (FIG. 4). When backplane 226 is properly aligned, the two inner holes 412' align with holes 240 of support member 234. When backplane 226 is not properly aligned, the two inner holes 412' will be misaligned and the screws will not engage card cage 200 to secure backplane 226.

End support members 404, 406 can include additional structures. For example, the notch 410 provides a registration point as discussed above in conjunction with FIG. 4. Each support member 404, 406 includes two notches 410. Each notch 410 is a recess along an edge of one of end support members 404, 406. Notches 410 accommodate registration pin 430, which extends from and interior surface of sidewalls 202, 204. Each notch 410 is disposed on a corner of corresponding end support members 404, 406. Each notch 410 has an opening with a forward facing portion 410*a* and a side facing portion 410*b* (FIG. 12). Thus, as backplane 226 is positioned, backplane is moved forward and registration pin 230 enters notch 410 through the forward facing portion 410*a* and, once in place, is disposed through side facing portion 410*b*.

Each end support member 404, 406 also includes two guide holes 414'. Guide holes 414' provide a further mechanism to ensure that backplane 226 is properly positioned.

Figure 13:
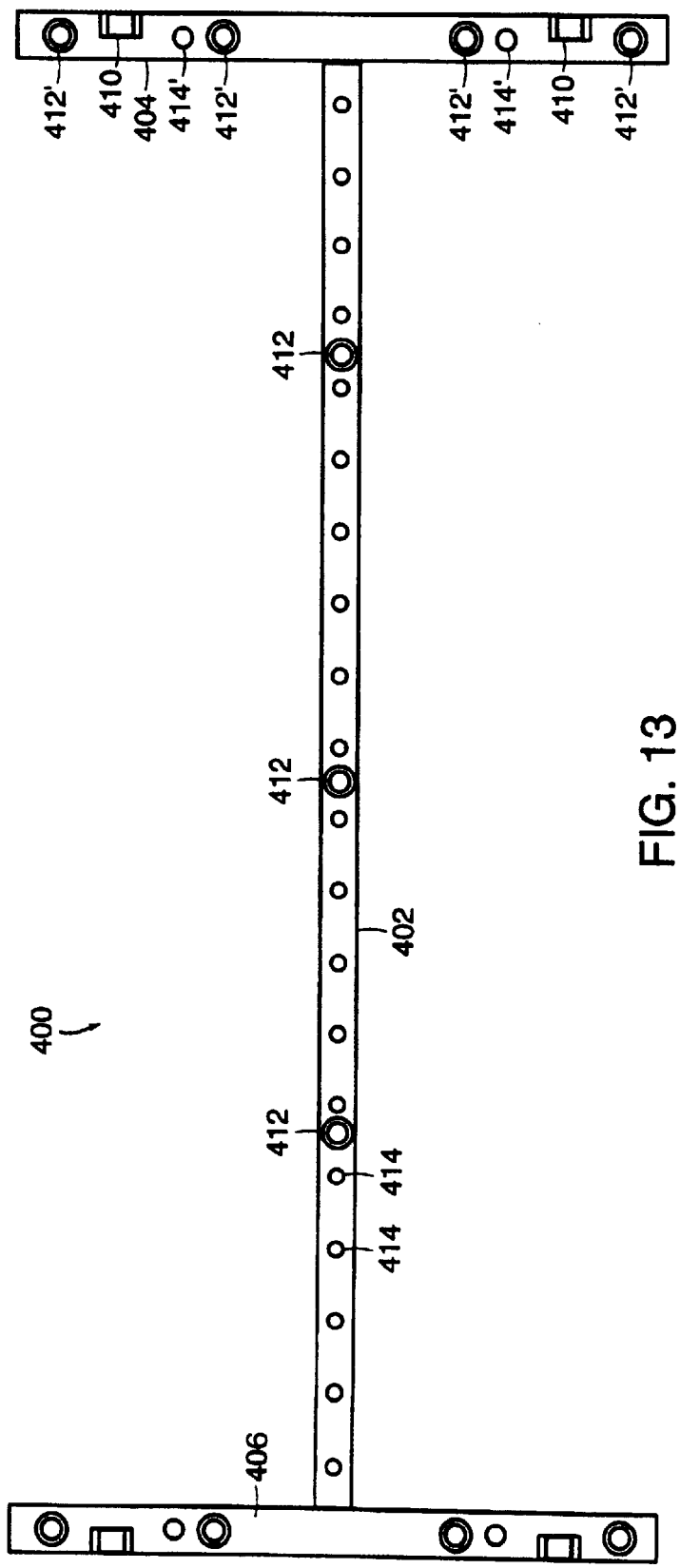
FIG. 13 is schematic view of a support device of the backplane of FIG. 11.
Figure 14:
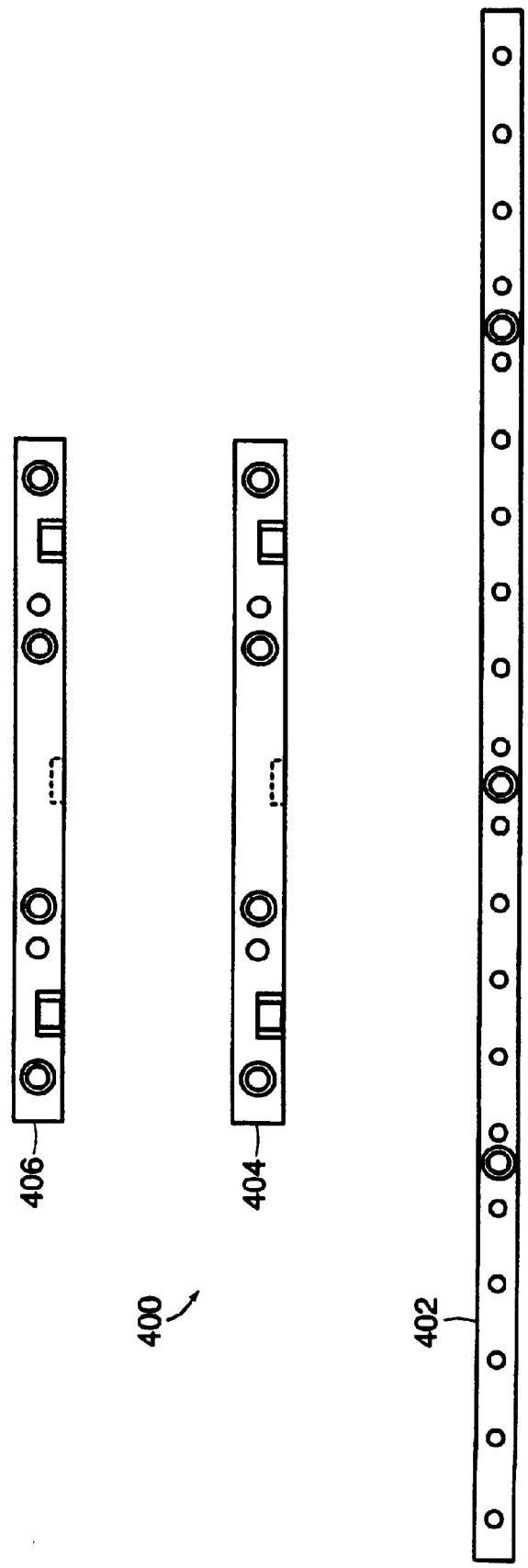
FIG. 14 is a schematic view of an alternate embodiment of the support device of FIG. 13.

End support members 404, 406 can be attached to cross member 402 using several different embodiments. For example, as shown in FIG. 13, end support members 404, 406 can be directly attached to the ends of cross member 402, e.g., by a weld, a rivet or a screw. In another embodiment, end support members 404, 406 can extend over the corresponding ends of cross member 402 but not be directly attached to the ends. In these embodiments, end support members 404, 406 can provide both a means to fix backplane 226 to card cage 200 as well as additional structural support for cross member 402. Alternatively, end support members 404, 406 can abut the corresponding ends of cross member 402 without overlapping the ends in the direction of motion of daughter board 216. In the later embodiment, end support members 404, 406 provide a means to attach backplane 226 to card cage 200 without further reinforcing cross member 402 in the direction of motion of daughter board 216. Also, support device 400 can be manufactured as a single integrated member.

Support device 400 is installed as part of backplane 226 prior to installing backplane 226 within card cage 200. Thus installed, backplane 226 has additional structural support, a mechanism to register the position of backplane 226 within card cage 200, a mechanism to quickly attach backplane 226 to card cage 200, and cabinet 10 has a reduced part count at the time of installing components such as backplane 226.

Support device 400 is symmetrical about a horizontal axis, i.e., an axis extending longitudinally along cross member 402. Support device is also symmetrical about a vertical axis, i.e., an axis parallel to end support members 404, 406. The structure of both end support members 404, 406 is identical. Therefore, end support members 404, 406 are interchangeable. Also, cross member 402 can be installed as shown or rotated 180 degrees with each end of cross member 402 adjacent to the opposite end support member 404, 406.

In addition, support device 400 can be installed on either side of backplane 226. Thus, as shown in FIG. 12, an identical supplemental support member 400' can be installed upon the opposite side of backplane 226. As shown, supplemental support member 400' entirely overlays support member 400 in the direction of motion of daughter board 216. Thus, supplemental support member 400' is expected to provide improved reinforcement and support of backplane 226.

Figure 15:
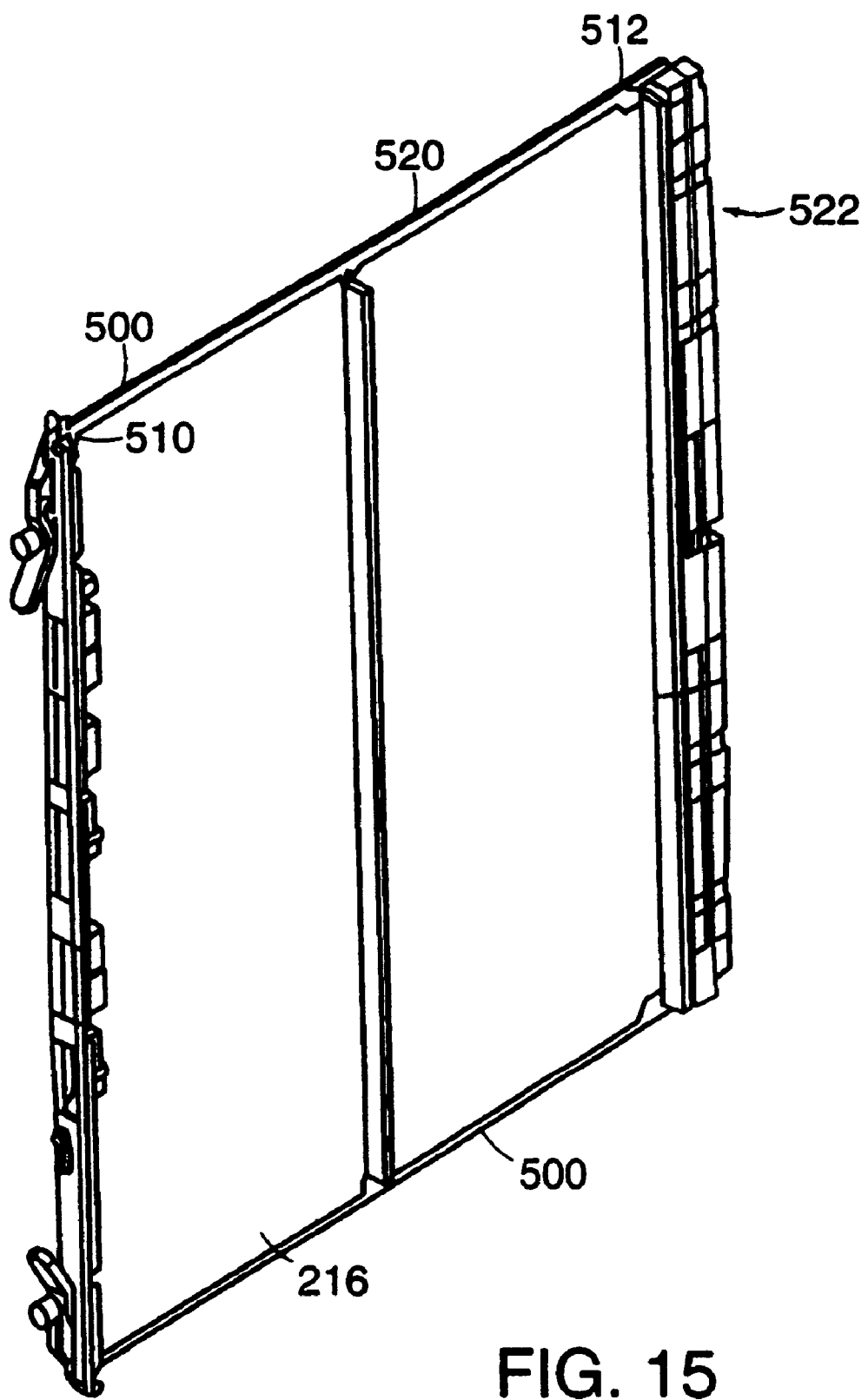
FIG. 15 is an isometric view of the printed circuit daughter board of FIG. 4, wherein two stiffeners are shown attached to top and bottom edges of the printed circuit daughter board.
Figure 16:
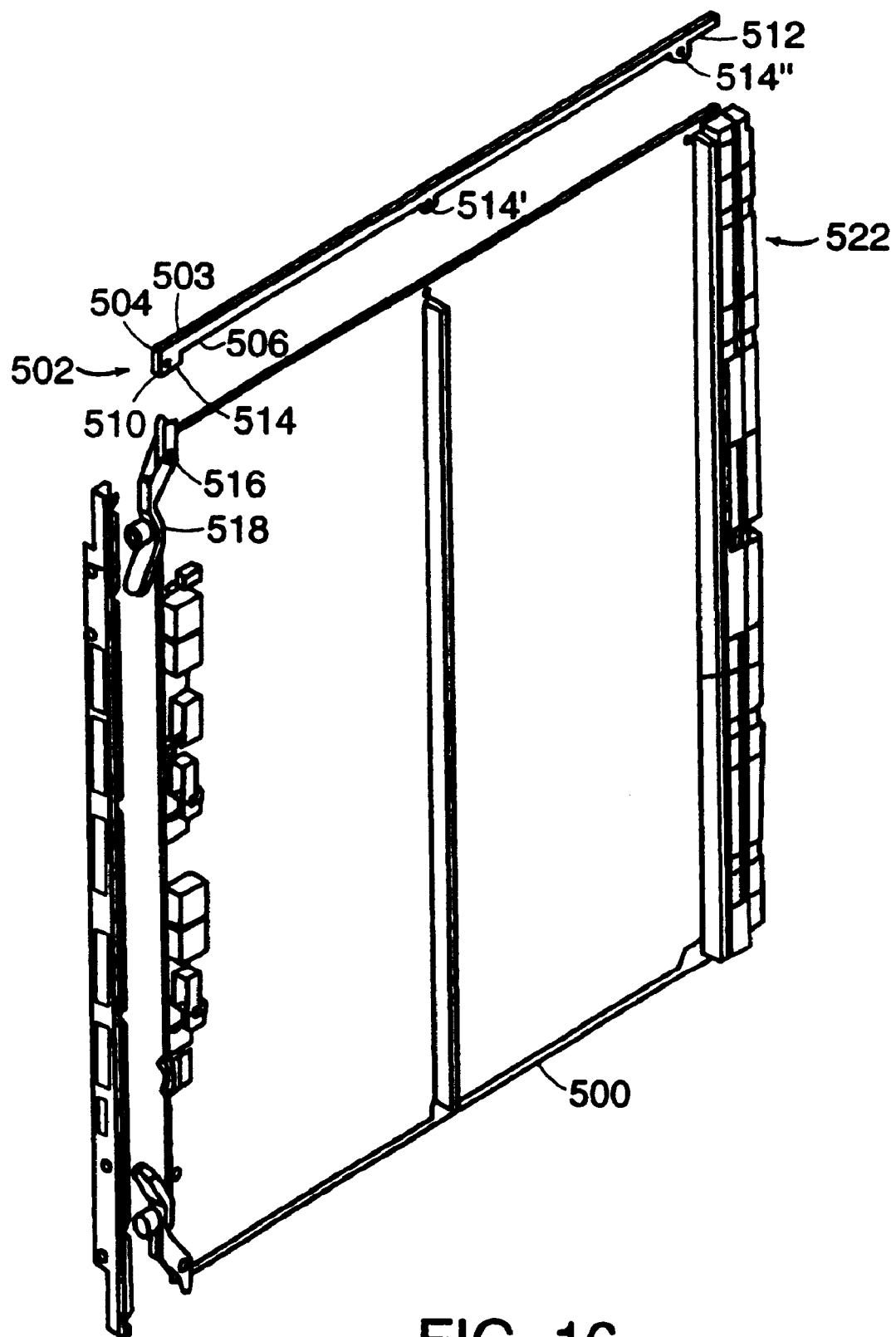
FIG. 16 is an exploded isometric view of the printed circuit daughter board of FIG. 15.

Referring to FIGS. 15–16, daughter board 216 includes a different type of stiffener 500 for inserting and removing daughter board 216, e.g., from slot 218 (FIG. 4) without buckling or breaking daughter board 216. Stiffener 500 is a rigid elongated member that has an elongated channel 502 that extends along the elongated member. Stiffener 500 includes an engagement portion 510, a driver portion 512 and a force translator portion 520 extending between engagement portion 510 and driver portion 512. Stiffener 500 is, e.g., metal finished with an electrodeposited zinc coating.

Channel 502 is defined by three distinct portions of stiffener 500: two lateral portions 504, 506 extend in parallel from a cap portion 508. The three portions 504, 506, 508 are connected at right angles to form a U-shaped member. Stiffener 500 attaches to daughter board 216 along an edge of daughter board 216 that moves through slot 218. The edge of daughter board 216 fits within channel 502, and stiffener 500 extends substantially along the entire edge of daughter board 216, e.g., from a front portion of daughter board 216 where force is applied to a back portion of daughter board 216 where force is distributed.

When attached to daughter board 216, stiffener 500 is oriented so that engagement portion 510 receives a force applied either to electrically connect daughter board 216 with backplane 226 (FIG. 5) or to electrically disconnect daughter board 216 from backplane 226.

Engagement portion 510 flares downward away from cap portion 508 to provide additional area in which to place a hole 514 to accommodate a pivot pin 516. Pivot pin 516 provides both an attachment mechanism as well as a fulcrum to apply insertion and extraction forces. As shown most clearly by comparing FIGS. 15 and 16, when stiffener 500 is attached to daughter board 216, pivot pin 516 extends through both engagement portion 510 and a card injector/ejector lever 518. Thus, due to the force of pivot pin 516 against engagement portion 510, force applied from lever 518 is translated through stiffener 500.

Alternatively, engagement portion 510 can be oriented in other position. For example, the end of engagement portion 510 could abut pivot pin 516 to translate an insertion force without directly contacting pivot pin 516 when an extraction force is applied to daughter board 216. Similarly, stiffener 500 could be attached to daughter board 216 without abutting pivot pin 516 when either an extraction or insertion force is applied to daughter board 216.

When attached to daughter board 216, stiffener 500 is oriented so that driver portion 512 is directly adjacent to a surface of electrical connector mechanism 522. Electrical connector mechanism includes the electrical connectors that engage backplane 226. Driver portion 512 forms a right angled notch that abuts a corner surface of electrical connector mechanism 522 to force electrical connector mechanism 522 into electrical connectors of backplane 226 and electrically connect daughter board 216 to backplane 226.

As configured, driver portion 512 does not exert a force on electrical connector mechanism 522 during extraction of daughter board 216 because driver portion 512 abuts electrical connector mechanism 522 and is not otherwise attached to connector mechanism 522 in the opposite direction. Rather, during extraction of daughter board 216, the extraction force is translated through stiffener 500 and applied to daughter board 216 via attachment points 514', 514".

Attachment points 514', 514" are parallel pairs of tabs arranged along stiffener 500 on opposite sides of channel 502. Each tab of attachment points 514', 514" includes a hole to accommodate a screw or a pin. The pairs of holes of each attachment point 514', 514" are aligned across channel 502 so that, e.g., the screw or pin extends through the holes and through the daughter board 216.

During insertion of daughter board 216, attachment points 514', 514" are thought to distribute the applied force through daughter board 216 in conjunction with driver portion 512. During extraction, attachment points 514', 514" are thought to bear the entire force applied force through engagement portion 510 (discounting frictional forces between stiffener 500 and daughter board 216). However, alternatively, driver portion 512 could include, e.g., an additional lip or ridge capable of engaging connector mechanism 522 during extraction of daughter board 216. In such a configuration, driver portion 512 would distribute some or all of the force applied to engagement portion 510.

One skilled in the art may now make numerous modifications and uses of and departures from the specific apparatus and techniques disclosed herein without departing from the inventive concepts. The invention has been described with reference to vertical and horizontal directions. However, other orientations are possible (e.g., card cage 200 could be rotated 90 degrees to lie on one side). All materials, dimensions, configurations, orientations, and combinations are provided as illustrative examples only and are not intended to be the only possible embodiments within the scope of the claims. Consequently, the invention is to be construed as embracing each and every novel feature and novel combination of features present in or possessed by the apparatus and techniques disclosed herein and limited only by the spirit and scope of the appended claims.

What is claimed is:

1. A stiffener for a printed circuit board adapted to be inserted and removed within a slot of a card cage having an electrical connector, comprising:

a card injector/ejector;

a rigid elongated member defining an elongated channel, the member having an engagement portion near a first end of the member, the card injector/ejector being pivotally mounted to the engagement portion for receiving an applied force; and an edge of the printed circuit board secured to the member and extending along the channel, the member adapted to translate the applied force to the engagement portion to move the printed circuit board in a direction of motion during insertion of the printed circuit board into the slot.

2. The stiffener of claim 1 wherein such stiffener further comprises a driver portion and a force translator portion, the driver portion and the engagement portion separated by the translator portion, the translator portion adapted to translate the applied force from the engagement portion to the driver portion, the driver portion disposed directly adjacent to an electrical connecting device of the printed circuit board.

3. The stiffener of claim 2 wherein the driver portion is in contact with the electrical connecting device.

4. The stiffener of claim 1 wherein the stiffener further comprises a cap section and two lateral sections, the cap section extending between the lateral sections, the cap and lateral sections defining the channel, the lateral sections adapted to provide support for the printed circuit board in a direction transverse to the direction of motion.

5. The stiffener of claim 4 further comprising a fulcrum; and wherein the engagement portion is directly adjacent to the fulcrum, the engagement portion adapted to receive the applied force from the fulcrum.

6. The stiffener of claim 1 wherein the stiffener further comprises an attachment point disposed along the stiffener, the attachment point disposed adjacent to the edge of the printed circuit board when the edge of the printed circuit board.

7. The stiffener of claim 6 wherein the attachment point includes an attachment pin for attaching the engagement portion to the printed circuit board, the attachment pin extending through a portion of the printed circuit board within the channel.

* * * * *